(12) United States Patent
Komyo et al.

(10) Patent No.: US 10,134,462 B2
(45) Date of Patent: *Nov. 20, 2018

(54) MEMORY WITH TERMINATION CIRCUIT

(71) Applicant: Renesas Electronics Corporation, Koutou-ku, Tokyo (JP)

(72) Inventors: Masayasu Komyo, Tokyo (JP); Yoichi Iizuka, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/684,461

(22) Filed: Aug. 23, 2017

(65) Prior Publication Data

US 2017/0352401 A1 Dec. 7, 2017

Related U.S. Application Data

(63) Continuation of application No. 15/016,594, filed on Feb. 5, 2016, now Pat. No. 9,767,884, which is a
(Continued)

(30) Foreign Application Priority Data

Sep. 8, 2009 (JP) .................................. 2009-206881

(51) Int. Cl.
*H03K 19/00* (2006.01)
*H03K 19/0175* (2006.01)
(Continued)

(52) U.S. Cl.
CPC ............ *G11C 11/4074* (2013.01); *G11C 7/02* (2013.01); *G11C 7/22* (2013.01); *G11C 11/419* (2013.01);
(Continued)

(58) Field of Classification Search
None
See application file for complete search history.

(56) References Cited

U.S. PATENT DOCUMENTS

| 5,467,455 A | 11/1995 | Gay et al. |
| 6,338,113 B1 | 1/2002 | Kubo et al. |

(Continued)

FOREIGN PATENT DOCUMENTS

| CN | 1692343 A | 11/2005 |
| CN | 1702769 A | 11/2005 |

(Continued)

OTHER PUBLICATIONS

Chinese Office Action and English translation, Application No. 201410398881.7, dated Oct. 18, 2017, 6 pages.
(Continued)

*Primary Examiner* — Jany Richardson
(74) *Attorney, Agent, or Firm* — Foley & Lardner LLP

(57) ABSTRACT

A semiconductor integrated circuit is described. A transmitter-receiver transmits and receives data to and from outside by a first external terminal and transmits a first control signal by a second external terminal. When another data is transmitted after the data is transmitted and when a data transmission interval from a time when the data is transmitted to a time when the another data is transmitted is equal to or smaller than a first threshold, the transmitter-receiver continuously outputs, from the first external terminal, a potential level of about ½ of a potential level obtained by adding a first potential level and a second potential level, during the data transmission interval, and changes the second potential level of the first control signal to the first potential level when the data transmission interval exceeds the first threshold.

9 Claims, 4 Drawing Sheets

Related U.S. Application Data continuation of application No. 14/579,364, filed on Dec. 22, 2014, now Pat. No. 9,286,958, which is a continuation of application No. 14/031,462, filed on Sep. 19, 2013, now Pat. No. 8,952,719, which is a continuation of application No. 13/271,819, filed on Oct. 12, 2011, now Pat. No. 8,558,572, which is a continuation of application No. 12/876,747, filed on Sep. 7, 2010, now Pat. No. 8,102,186.

(51) Int. Cl.
*H03K 19/003* (2006.01)
*G11C 11/4074* (2006.01)
*G11C 7/02* (2006.01)
*G11C 11/419* (2006.01)
*G11C 7/22* (2006.01)

(52) U.S. Cl.
CPC . *H03K 19/0005* (2013.01); *H03K 19/017545* (2013.01)

(56) References Cited

U.S. PATENT DOCUMENTS

| | | | |
|---|---|---|---|
| 6,356,106 B1* | 3/2002 | Greeff | G06F 13/4086 326/30 |
| 6,380,758 B1 | 4/2002 | Hsu et al. | |
| 6,489,808 B2 | 12/2002 | Iizuka | |
| 6,904,552 B2 | 6/2005 | Cowles | |
| 6,917,546 B2 | 7/2005 | Matsui | |
| 6,970,369 B2 | 11/2005 | Funaba et al. | |
| 7,130,228 B2 | 10/2006 | Janzen | |
| 7,142,461 B2 | 11/2006 | Janzen | |
| 7,242,635 B2 | 7/2007 | Okuda | |
| 7,808,269 B2 | 10/2010 | Matsudera | |
| 7,839,705 B2 | 11/2010 | Park | |
| 7,974,143 B2 | 7/2011 | Lee | |
| 7,999,572 B2 | 8/2011 | Komyo et al. | |
| 8,076,954 B2 | 12/2011 | Murayama et al. | |
| 8,253,436 B2 | 8/2012 | Komyo et al. | |
| 8,552,758 B2 | 10/2013 | Komyo et al. | |
| 8,653,851 B2 | 2/2014 | Komyo et al. | |
| 8,907,699 B2 | 12/2014 | Komyo et al. | |
| 2003/0039151 A1 | 2/2003 | Matsui | |
| 2003/0080774 A1 | 5/2003 | Funaba | |
| 2004/0098528 A1 | 5/2004 | Janzen | |
| 2004/0250165 A1 | 12/2004 | Tanizaki | |
| 2005/0047246 A1 | 3/2005 | Kyung | |
| 2005/0047546 A1 | 3/2005 | Fox et al. | |
| 2005/0262289 A1 | 11/2005 | Okuda | |
| 2005/0265116 A1 | 12/2005 | Hara et al. | |
| 2006/0050597 A1* | 3/2006 | Janzen | G06F 13/4086 365/230.06 |
| 2010/0329041 A1 | 12/2010 | Sohn et al. | |
| 2011/0057720 A1 | 3/2011 | Komyo et al. | |
| 2011/0057722 A1 | 3/2011 | Komyo et al. | |
| 2011/0255354 A1 | 10/2011 | Komyo et al. | |
| 2011/0261640 A1 | 10/2011 | Matsui | |
| 2011/0292739 A1 | 12/2011 | Song | |
| 2012/0060003 A1 | 3/2012 | Murayama et al. | |
| 2013/0282939 A1 | 10/2013 | Fu et al. | |
| 2013/0343144 A1 | 12/2013 | Komyo et al. | |
| 2014/0016401 A1 | 1/2014 | Komyo et al. | |
| 2014/0119142 A1 | 5/2014 | Komyo et al. | |

FOREIGN PATENT DOCUMENTS

| | | |
|---|---|---|
| JP | 04-085791 A | 3/1992 |
| JP | 07-182078 A | 7/1995 |
| JP | 09-152923 A | 6/1997 |
| JP | 11-353228 A | 12/1999 |
| JP | 2000-295087 A | 10/2000 |
| JP | 2002-222921 A | 8/2002 |
| JP | 2003-068082 A | 3/2003 |
| JP | 2003-085121 A | 3/2003 |
| JP | 2004-153690 A | 5/2004 |
| JP | 2005-044494 A | 2/2005 |
| JP | 2006-040318 A | 2/2006 |
| JP | 2006-134334 A | 5/2006 |
| JP | 2007-193431 A | 8/2007 |
| JP | 2008-102706 A | 5/2008 |
| JP | 2008-103073 A | 5/2008 |
| JP | 2009-129522 A | 6/2009 |
| JP | 2009-171562 A | 7/2009 |

OTHER PUBLICATIONS

Chinese Office Action and English translation, Application No. 201410260671.1, dated Sep. 29, 2016, 11 pages.
Japanese Office Action, dated Apr. 8, 2014, 5 pages.
JEDEC Standard, DDR2 SDRAM Specification, JESD79-2E (Revision of JESD79-2D), JEDEC Solid State Technology Association, Apr. 2008, 125 pages.
USPTO Notice of Allowance, U.S. Appl. No. 12/876,760, dated May 4, 2012, 9 pages.
U.S. Notice of Allowance, U.S. Appl. No. 13/172,199. dated Oct. 7, 2013, 18 pages.
USPTO Notice of Allowance, U.S. Appl. No. 13/470,972, dated May 31, 2013, 16 pages.
U.S. Notice of Allowance dated Sep. 26, 2014.
USPTO Notice of Allowance, U.S. Appl. No. 14/148,135, dated Aug. 15, 2014, 16 pages.
USPTO Office Action, U.S. Appl. No. 13/172,199, dated Nov. 26, 2012, 13 pages.
USPTO Office Action, U.S. Appl. No. 14/148,135, dated Mar. 12, 2014, 9 pages.
U.S. Office Action, U.S. Appl. No. 14/537,452, dated Feb. 18, 2015, 11 pages.
USPTO Notice of Allowance, U.S. Appl. No. 12/876,793, dated Apr. 14, 2011, 10 pages.
USPTO Notice of Allowance, U.S. Appl. No. 14/014,104, dated Jul. 24, 2015, 9 pages.
USPTO Notice of Allowance, U.S. Appl. No. 14/537,452,dated Jun. 25, 2015, 12 pages.
USPTO Notice of Allowance, U.S. Appl. No. 14/579,364, dated Nov. 6, 2015, 10 pages.
USPTO Office Action U.S. Appl. No. 13/172,199, dated Mar. 27, 2013, 15 pages.
USPTO Office Action, U.S. Appl. No. 14/014,104, dated May 4, 2015, 9 pages.
USPTO Office Action, U.S. Appl. No. 14/579,364,dated Jul. 2, 2015.
USPTO Office Action, U.S. Appl. No. 14/859,942, dated Nov. 4, 2015, 11 pages.
USPTO Notice of Allowance, U.S. Appl. No. 14/920,313, dated Dec. 29, 2016, 9 pages.
USPTO Office Action, U.S. Appl. No. 14/920,313, dated Oct. 7, 2016, 11 pages.
USPTO Notice of Allowance, U.S. Appl. No. 14/859,942, dated Mar. 21, 2016, 10 PAGES.
Chinese Office Action and English translation, Application No. 20140398881.7, dated May 2, 2018, 6 pages.

* cited by examiner

MEMORY WITH TERMINATION CIRCUIT

CROSS-REFERENCE TO RELATED PATENT APPLICATIONS

This application is a continuation of U.S. Ser. No. 15/016,594, filed Feb. 5, 2016, which is a continuation of application Ser. No. 14/579,364, filed Dec. 22, 2014, which is a continuation of application Ser. No. 14/031,462, filed Sep. 19, 2013, now U.S. Pat. No. 8,952,719, issued Feb. 10, 2015, which is a continuation of application Ser. No. 13/271,819, filed Oct. 12, 2011, now U.S. Pat. No. 8,558,572, issued Oct. 15, 2013, which is a continuation of application Ser. No. 12/876,747, filed Sep. 7, 2010, now U.S. Pat. No. 8,102,186, issued January 24, 2012, and related to application Ser. No. 12/876,760, filed Sep. 7, 2010, now U.S. Pat. No. 8,253,436; issued Aug. 28, 2012, application Ser. No. 12/876,793, filed Sep. 7, 2010, now U.S. Pat. No. 7,999,572, issued August 16, 2011; and application Ser. No. 13/172,199, filed Jun. 29, 2011, now U.S. Pat. No. 8,653,851; issued Feb. 18, 2014, and based upon and claims the benefit of priority from Japanese Patent Application No. 2009-206881, filed Sep. 8, 2009, which are incorporated herein by reference in their entirety. This application claims only subject matter disclosed in the parent application and therefore presents no new matter.

BACKGROUND

1. Field of the Invention

The present invention relates to a semiconductor integrated circuit, and more particularly, to a semiconductor integrated circuit suitable for power-supply noise reduction.

2. Description of Related Art

In a semiconductor integrated circuit, there has been a problem that data transmission between transmitter-receivers is not accurately executed when power-supply noise occurs on signal lines used for the data transmission between the transmitter-receivers. To reduce the power-supply noise, reducing the impedance of the signal lines has been required.

Therefore, a countermeasure, for example, ODT (On Die Termination) technique has been provided to reduce the power-supply noise on signal lines used for data reception of transmitter-receivers (JEDEC STANDARD, DDR2 SDRAM SPECIFICATION JESD79-2E (Revision of JESD79-2D), April 2008, JEDEC SOLID STATE TECHNOLOGY ASSOCIATION). Specially, a bidirectional signal line for bidirectionally transmitting data between the transmitter-receivers is equipped with a termination circuit which switches on an ODT function when receiving the data and switches off the ODT function when not receiving the data in each transmitter-receiver.

SUMMARY

However, in the related art, in the case of data transmission between the transmitter-receivers through the bidirectional signal line, the power-supply noise occurs on the bidirectional signal line due to a sudden fluctuation of a power supply voltage when the receiver circuit, which is a data receiving side, switches off the ODT function after receiving data. When the receiver circuit switches the ODT function from the off-state to the on-state to receive another data before the power-supply noise converges, another data is influenced by the power-supply noise. The present inventors have found a problem in the related art that, as described above, it is impossible to execute transmission and reception of data accurately.

A first exemplary aspect of the present invention is a semiconductor integrated circuit including:

first and second transmitter-receivers that execute transmission and reception of data through a signal line, in which the first transmitter-receiver includes:
  a first termination circuit that includes a first resistor and a first switch, the first resistor being provided between a first power supply terminal and the signal line, the first switch controlling a current flowing through the first resistor to be turned on and off and
  a control circuit that outputs a first control signal to the first termination circuit so that the first switch is turned on when the first transmitter-receiver receives data, the first switch is turned off when the first transmitter-receiver transmits the data, and the first switch is continuously on during a first predetermined period after receiving the data when the first transmitter-receiver further receives another data after receiving the data.

With the circuit structure as described above, it is possible to execute transmission and reception of data accurately by reducing the power-supply noise.

According to an exemplary aspect of the present invention, it is possible to provide a semiconductor integrated circuit capable of executing transmission and reception of data accurately.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
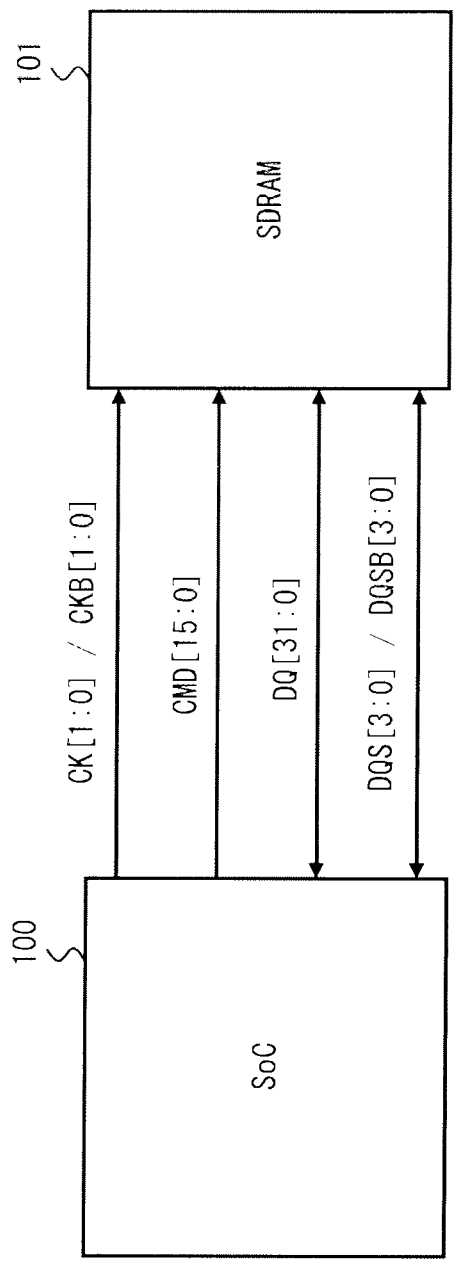
FIG. 1 illustrates a semiconductor integrated circuit according to a first exemplary embodiment of the present invention.

Specific exemplary embodiments of the present invention are described in detail below with reference to the drawings. The same components are denoted by the same reference numerals in the drawings, and for clarity of explanation, repeated explanation is omitted as appropriate.

[First Exemplary Embodiment]

Referring to the drawings, a semiconductor integrated circuit according to a first exemplary embodiment of the present invention will he described. The present invention can be applied to a circuit which includes a first transmitter-receiver, a second transmitter-receiver, and a signal line for bidirectionally transmitting data between the first transmitter-receiver and the second transmitter-receiver (hereinafter, referred to simply as "bidirectional signal line"), and has an ODT function. In this exemplary embodiment, a case is explained hereinafter in which the circuit shown in FIG. 1 includes an SoC (System on Chip) circuit and an SDRAM (Synchronous Dynamic Random Access Memory) circuit, and data transmission is executed between the SoC circuit and the SDRAM circuit through the bidirectional signal line.

FIG. 1 illustrates a semiconductor integrated circuit according to the first exemplary embodiment of the present invention. The circuit shown in FIG. 1 includes an SoC circuit (first transmitter-receiver) 100 and an SDRAM circuit (second transmitter-receiver) 101. Data transmission is executed between the SoC circuit 100 and the SDRAM circuit 101 in the DDR (double data rate) mode.

First, the circuit structure of the semiconductor integrated circuit according to the first exemplary embodiment of the present invention will be described. The SoC circuit 100 outputs a 2-bit clock signal CK and a 2-bit clock signal CKB, which is a differential signal of the clock signal CK, to the SDRAM circuit 101. The SoC circuit 100 further outputs a 16-bit control signal CMD, which includes commands for each address of the SDRAM circuit 101, to the SDRAM circuit 101. Note that the SDRAM circuit 101 receives the control signal CMD in synchronization with the clock signals CK and CKB.

Each of 32-bit data DQ, a 4-bit strobe signal DQS, and a 4-bit strobe signal DQSB, which is a differential signal of the strobe signal DQS, is bidirectionally transmitted and received between the SoC circuit 100 and the SDRAM circuit 101. A receiver circuit, which is one of the SoC circuit 100 and the SDRAM circuit 101, receives the data DQ in synchronization with the strobe signals DQS and DQSB. Note that the signal names described above also represent the corresponding signal line names.

Figure 2:
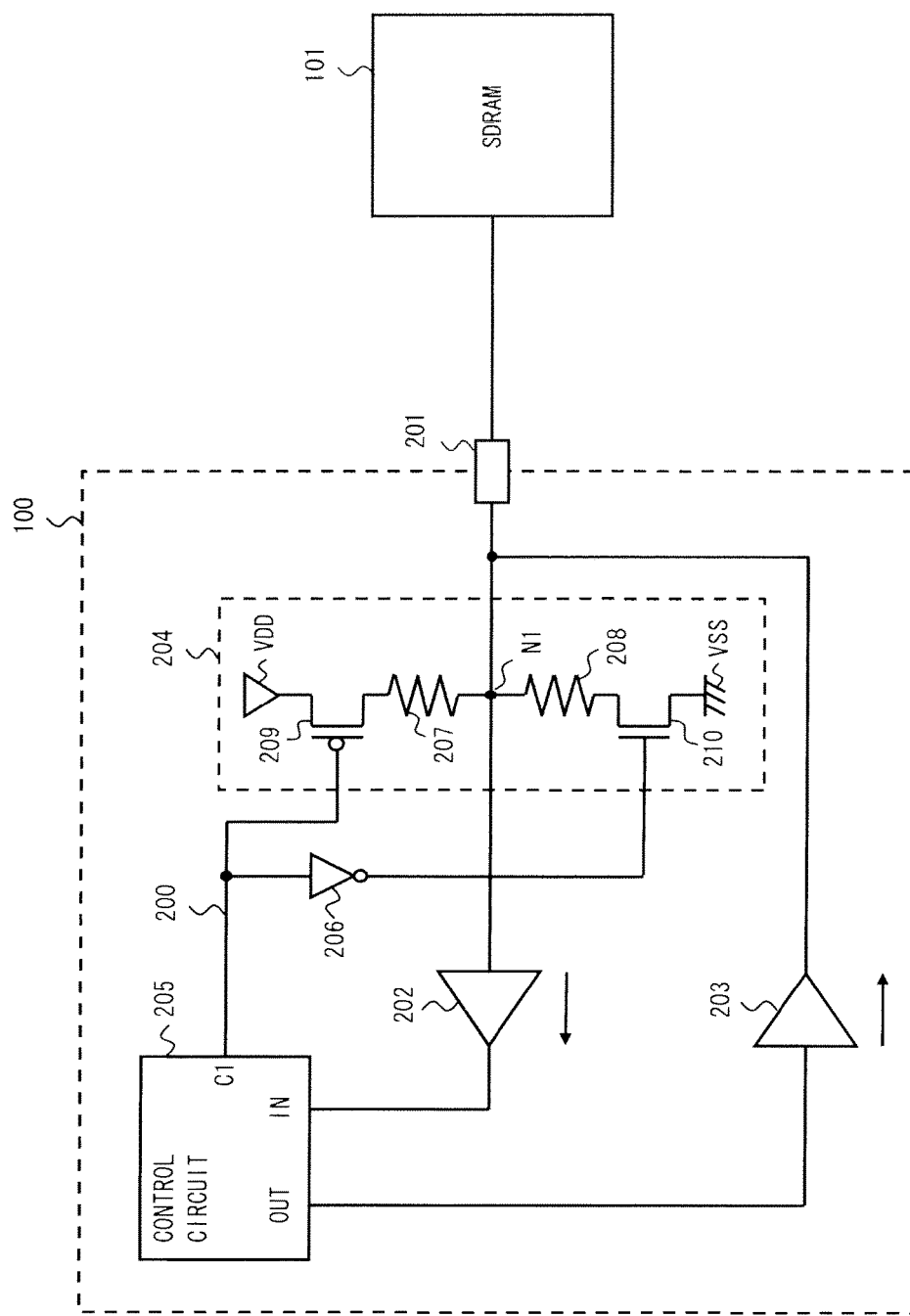
FIG. 2 illustrates the semiconductor integrated circuit according to the first exemplary embodiment of the present invention.

The circuit shown in FIG. 2 shows a 1-bit bidirectional signal line, which is one of strobe signal lines DQS[3:0] and DQSB[3:0] and a data signal line DQ[31:0], and corresponding peripheral circuits of the circuit shown in FIG. 1. In this exemplary embodiment, a case is explained hereinafter in which the 1-bit bidirectional signal line is the data signal line DQ[0]. The data signal line DQ[0] is connected between the SoC circuit 100 and the SDRAM 101 as described above.

The SoC circuit 100 includes an external terminal 201, a buffer 202, a buffer 203, a termination circuit (first termination circuit) 204 which has an ODT function, a control circuit 205 which outputs a control signal (first control signal) 200 to control the ODT function of the termination circuit 204 to be turned on and off, and an inverter 206. The termination circuit 204 includes a resistor (first resistor) 207, a resistor 208, a switch (first switch) 209, and a switch 210. In this exemplary embodiment, a case is explained in which the switch 209 is a P-channel MOS transistor and the switch 210 is an N-channel MOS transistor.

In the SoC circuit 100, the data signal line DQ[0] is connected to an input terminal of the buffer 202 and an output terminal of the buffer 203 through the external terminal 201.

The termination circuit 204 is provided between the external terminal 201 and the buffer 202. In the termination circuit 204, the switch 209 and the resistor 207 are connected in series between a high potential side power supply terminal VDD and a node N1 which is located on the signal line connecting the external terminal 201 and the buffer 202. The switch 210 and the resistor 208 are connected in series between a low potential side power supply terminal VSS and the node N1. In other words, the source terminal of the switch 209 is connected to the high potential side power supply terminal VDD. The drain terminal of the switch 209 is connected to one terminal of the resistor 207. The other terminal of the resistor 207 is connected to one terminal of the resistor 208. The other terminal of the resistor 208 is connected to the drain terminal of the switch 210. The source terminal of the switch 210 is connected to the low potential side power supply terminal VSS. The other terminal of the resistor 207 and one terminal of the resistor 208 are commonly connected to the node N1. Note that the switch 209 and the resistor 207 which are connected in series between the high potential side power supply terminal VDD and the node NI may be switched around. Similarly, the switch 210 and the resistor 208 which are connected in series between the low potential side power supply terminal VSS and the node N1 may be switched around.

An output terminal of the buffer 202 is connected to an input terminal IN of the control circuit 205. An input terminal of the buffer 203 is connected to an output terminal OUT of the control circuit 205. An output terminal C1 of the control circuit 205 is connected to the gate terminal of the switch 209 and the gate terminal of the switch 210 through the inverter 206. Such a peripheral circuit configuration is also employed in the other bidirectional signal lines. Note that the control circuit 205 is commonly provided to these bidirectional signal lines.

Next, the operation of the semiconductor integrated circuit according to the first exemplary embodiment of the present invention will be described. A case is explained hereinafter in which the SoC circuit 100 receives (reads) the data such as the data DQ and the strobe signals DQS and DQSB transmitted from the SDRAM circuit 101. First, the SoC circuit 100 outputs the control signal CMD to the SDRAM circuit 101. After that, for example, the SDRAM circuit 101 transmits the data DQ stored in a memory area of an address specified by the control signal CMD, and the strobe signals DQS and DQSB to the SoC circuit 100. In this case, the data DQ transmitted from the SDRAM circuit 101 has a predetermined burst length.

The SoC circuit 100 receives each signal output from the SDRAM circuit 101 through the corresponding signal line, external terminal 201, and buffer 202. Note that the SoC circuit 100 receives the data DQ in synchronization with the strobe signals DQS and DQSB. The data DQ received by the SoC circuit 100 is input to the control circuit 205 and the other peripheral circuits (not shown). A period between the time when the SoC circuit 100 starts to transmit the control signal CMD and the time when the SoC circuit 100 starts to receive the corresponding data DQ is called a read latency (RL).

When receiving the data transmitted from the SDRAM circuit 101, the SoC circuit 100 controls the DDT function of the corresponding termination circuit 204 to be turned on to reduce power-supply noise occurring on the data signal line DQ and the strobe signal lines DQS and DQSB. Specifically, the SoC circuit 100 controls the switches 209 and 210, which are provided in the corresponding termination circuit 204, to be turned on based on the control signal (first control signal) 200 from the control circuit 205 and sets the node on the corresponding signal line to a predetermined potential (for example, one-half of the high potential side power supply voltage VDD). This makes it possible for the SoC circuit 100 to receive the data accurately by reducing the power-supply noise included in the received data.

A case is explained hereinafter in which the SoC circuit 100 transmits (writes) the data to the SDRAM circuit 101. First, the SoC circuit 100 outputs the control signal CMD to the SDRAM circuit 101. After that, the SoC circuit 100 transmits the data DQ and the strobe signals DQS and DQSB to the SDRAM circuit 101. In this case, the data DQ transmitted from the SoC circuit 100 has a predetermined burst length.

Then, the SDRAM circuit 101 receives the data DQ in synchronization with the strobe signals DQS and DQSB. For example, the data DQ is written into the memory area of the address specified by the control signal CMD. A period between the time when the SoC circuit 100 starts to transmit the control signal CMD and the time when the SoC circuit 100 starts to transmit the corresponding data DQ is called a write latency (WL).

When transmitting the data to the SDRAM circuit 101, the SoC circuit 100 controls the ODT function of the corresponding termination circuit 204 to be turned off. Specifically, the SoC circuit 100 controls the switches 209 and 210, which are provided in the corresponding termination circuit 204, to be turned off based on the control signal 200 from the control circuit 205, thereby preventing the potential of the data transmitted to the SDRAM circuit 101 through the buffer 203 and the external terminal 201 from being decayed. This makes it possible for the SoC circuit 100 to transmit the data accurately.

In this manner, the SoC circuit 100 switches between a read mode in which the SoC circuit 100 receives the data transmitted from the SDRAM circuit 101 and a write mode in which the SoC circuit 100 transmits the data to the SDRAM circuit 101, based on the control signal CMD. Note that the SoC circuit 100 outputs the control signal CMD which has a data length corresponding to one cycle of the clock signal CK at predetermined time intervals.

For example, the SoC circuit 100 receives data such as the data DQ in the read mode or transmits the data in the write mode, and after the predetermined time interval, receives or transmits another data in the same mode. Alternatively, the SoC circuit 100 receives data such as the data DQ in the read mode or transmits the data in the write mode, and after the predetermined time interval, receives or transmits another data in a different mode, The data transmission and reception as described above is repeated.

The SoC circuit 100 according to this exemplary embodiment exhibits characteristics when the SoC circuit 100 receives data such as the data DQ in the read mode, and after the predetermined time interval, receives another data in the read mode again. The operation of the SoC circuit 100 in this case will be described with reference to FIG. 3.

First, the SoC circuit 100 outputs the control signal CMD (which is indicated by "A" shown in FIG. 3 and is hereinafter referred to as "read command A") to the SDRAM circuit 101. Then, the SDRAM circuit 101 transmits the data DQ ("D" shown in FIG. 3), which has a predetermined burst length, and the corresponding strobe signals DQS and DQSB to the SoC circuit 100 after the period of the read latency RL ("C" shown in FIG. 3).

In this case, when receiving the data through the bidirectional signal lines (the data signal line DQ and the strobe signal lines DQS and DQSB), the SoC circuit 100 controls the ODT function of the corresponding termination circuit 204 to be turned on.

Figure 3:
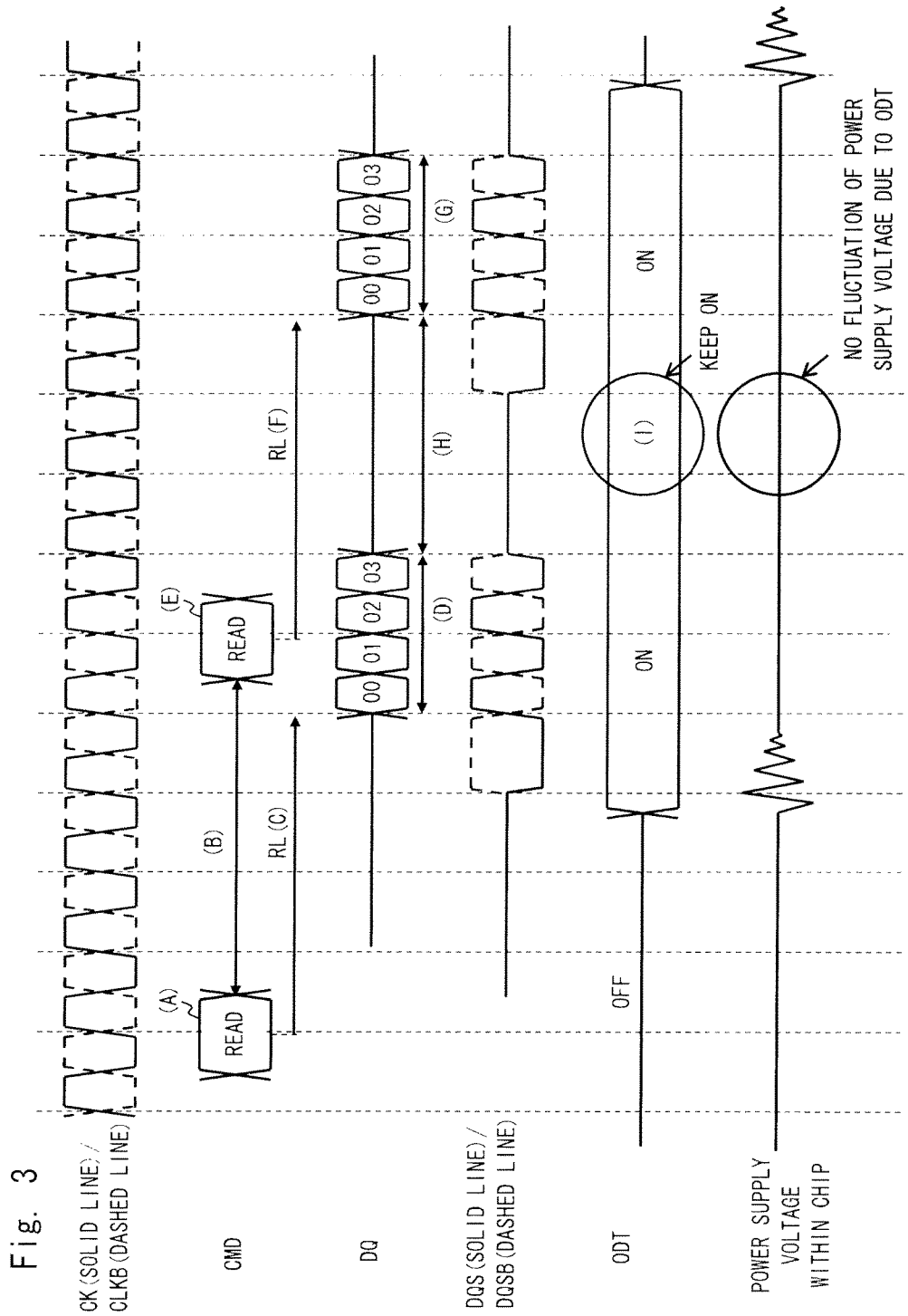
FIG. 3 is a timing chart depicting an operation of the semiconductor integrated circuit according to the first exemplary embodiment of the present invention.

After outputting the read command A, the SoC circuit 100 outputs a read command E ("E" shown in FIG. 3) after the period of the predetermined time interval ("B" shown in FIG. 3). The SDRAM circuit 101 transmits the data DQ ("G" shown in FIG. 3), which has a predetermined burst length, and the corresponding strobe signals DQS and DQSB to the SoC circuit 100 after the period of the read latency RL ("F" shown in FIG. 3)

In this case, the control circuit 205 provided in the SoC circuit 100 calculates a period (H), in which the data DQ is not transmitted, based on the interval (B) of the read commands (A, E), the read latency RL (C, F), and the burst length (D, G) of the data DQ. Based on the period thus obtained, the control circuit 205 determines whether to turn off the ODT function of the termination circuit 204 during the period (H) in which the data DQ is not transmitted. Then, the control circuit 205 outputs the control signal 200 to the termination circuit 204 based on the results of the determination. When the period (H) is less than or equal to a predetermined threshold, the termination circuit 204 causes the ODT function to be continuously on during the period (H) ("I" shown in FIG. 3). When the period (H) exceeds the predetermined threshold, the termination circuit 204 switches off the ODT function during the period (H).

In the case where the read mode is repeated, when the termination circuit 204 causes the ODT function to be continuously on during the period in which the data transmission is not executed, power-supply noise, which may occur due to switching from the on-state to the off-state of the ODT function, does not occur on the bidirectional signal line corresponding to the termination circuit 204. Therefore, it is possible for the SoC circuit 100 to receive the data accurately by reducing the power-supply noise which has been a problem in the related art.

In the case where the read mode is repeated, when the period (H) in which the data transmission is not executed exceeds the threshold, the termination circuit 204 switches the ODT function from the on-state to the off-state during the period in which the data transmission is not executed. In other words, the SoC circuit 100 can control the ODT function of the termination circuit 204 to be switched from the off-state to the on-state again after a lapse of a period sufficient for converging the power-supply noise due to switching from the on-state to the off-state of the ODT function. This makes it possible for the SoC circuit 100 to receive the data accurately by reducing the effect of the power-supply noise. Note that the timing of switching from the on-state to the off-state of the ODT function may be arbitrarily determined as long as the power-supply noise is converged by the time when the next data reception starts.

As described above, in the case where the receiver circuit (for example, the SoC circuit 100) continuously receives data, the semiconductor integrated circuit according to this exemplary embodiment of the present invention controls the ODT function of the receiver circuit to be turned on and off based on a data reception interval. In other words, the semiconductor integrated circuit according to this exemplary embodiment controls the ODT function of the receiver circuit to be continuously on or to be switched from the on-state to the off-state. This makes it possible for the semiconductor integrated circuit according to this exemplary embodiment to execute transmission and reception of data accurately by reducing the effect of the power-supply noise.

[Second Exemplary Embodiment]

In the first exemplary embodiment, the case has been explained in which the SoC circuit 100 includes the termination circuit 204. Meanwhile, in this exemplary embodiment, a case is explained in which an SDRAM circuit also includes a termination circuit.

Figure 4:
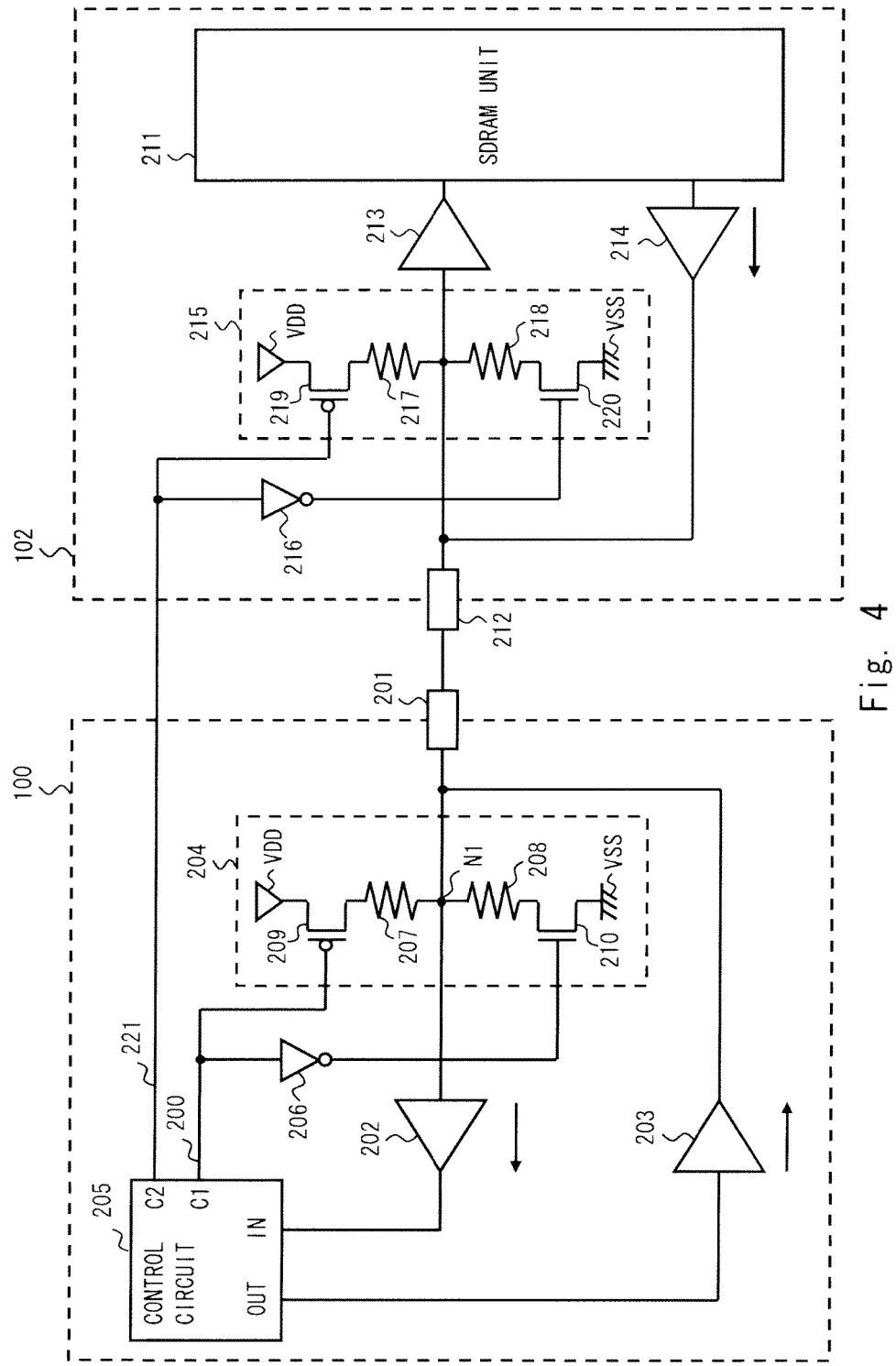
FIG. 4 illustrates a semiconductor integrated circuit according to a second exemplary embodiment of the present invention.

Referring to FIG. 4, an S DRAM circuit 102 which corresponds to the SDRAM circuit 101 shown in FIG. 2 further includes a termination circuit (second termination circuit) 215. FIG. 4 shows the 1-bit bidirectional signal line, which is one of the strobe signal lines DQS[3:0] and DQSB[3:0] and the data signal line DQ[31:0], and the corresponding peripheral circuits.

The circuit shown in FIG. 4 includes the SoC circuit 100 and the SDRAM circuit 102. The SDRAM circuit 102 includes an SDRAM unit 211, an external terminal 212, a buffer 213, a buffer 214, a termination circuit 215, and an inverter 216. The termination circuit 215 includes a resistor (second resistor) 217, a resistor 218, a switch (second switch) 219, and a switch 220. The circuit structure and the operation of the SoC circuit 100 are the same as those of the first exemplary embodiment, so the description thereof is omitted. As for the connections and the operations of circuits which are associated with the ODT function and provided in the SDRAM circuit 102, only different contents from those of the SoC circuit 100 will be described.

When receiving the data transmitted from the SoC circuit 100, the SDRAM circuit 102 controls the ODT function of the corresponding termination circuit 215 to be turned on to reduce the power-supply noise occurring on the data signal line DQ and the strobe signal lines DQS and DQSB. Specifically, the SDRAM circuit 102 controls the switches 219 and 220, which are provided in the corresponding termination circuit 215, to be turned on based on a control signal (second control signal) 221 from the control circuit 205 and sets the node on the corresponding signal line to the predetermined potential (for example, one-half of the high potential side power supply terminal VDD). This makes is possible for the SDRAM circuit 102 to receive the data accurately by reducing the power-supply noise included in the received data.

When transmitting the data to the SoC circuit 100, the SDRAM circuit 102 controls the ODT function of the corresponding termination circuit 215 to be turned off. Specifically, the SDRAM circuit 102 controls the switches 219 and 220, which are provided in the corresponding termination circuit 215, to be turned off based on the control signal 221 from the control circuit 205, thereby preventing the potential of the data transmitted to the SoC circuit 100 through the buffer 214 and the external terminal 212 from being decayed. This makes it possible for the SDRAM circuit 102 to transmit the data accurately. In addition, the connections and the operations of circuits, which are associated with the ODT function and provided in the SDRAM circuit 102, are the same as those of the first exemplary embodiment, so the description thereof is omitted.

With this circuit configuration, in the case where data transmission between the transmitter-receivers through the bidirectional signal, the semiconductor integrated circuit according to this exemplary embodiment can execute transmission and reception of data accurately by controlling the ODT function of the receiver circuit even if either one of the transmitter-receivers operates as the receiver circuit.

Note that the present invention is not limited to the above exemplary embodiments, but can be modified as appropriate within the scope of the present invention. For example, though the above-mentioned exemplary embodiments have described an example in which the semiconductor integrated circuit includes a single SDRAM circuit, the present invention is not limited thereto. The semiconductor integrated circuit according to the present invention is also applicable to a circuit configuration including a plurality of SDRAM circuits.

Though the above-mentioned exemplary embodiments have described an example in which, when the receiver circuit (for example, the SoC circuit 100) continuously receives data, the control circuit 205 outputs the control signal (for example, the control signal 200) based on the interval of the address command such as a read command, the read latency RL, and the burst length of the data DQ, the present invention is not limited thereto. The present invention is also applicable to a circuit configuration for outputting the control signal (for example, the control signal 200) based on at least one of the above-mentioned pieces of information (for example, the interval of the address command) if it is possible to control the ODT function based on the data reception interval.

Moreover, the termination circuit is not limited to the circuits illustrated in the above-mentioned exemplary embodiments. The present invention is also applicable to a circuit configuration including a resistor and a switch which are connected in series between the power supply terminal (first power supply terminal) having the predetermined potential (for example, one-half of the high potential side power supply voltage VDD) and the node on the corresponding bidirectional signal line.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
   a first termination circuit;
   a first external terminal;
   a second external terminal; and
   a transmitter-receiver that transmits and receives data to and from outside by the first external terminal and receives a first control signal by the second external terminal, wherein:
   when the data is received by the first external terminal, the first termination circuit is activated by the first control signal having a second potential level,
   when the data is transmitted by the first external terminal, the first termination circuit is inactivated by the first control signal having a first potential level, and
   when another data is received after the data is received,
     when a data reception interval from a time when the previous data is received to a time when the another data is received is equal to or smaller than a first threshold, the activation of the first termination circuit is maintained by the first control signal maintained at the second potential level, and
     when the data reception interval exceeds the first threshold, the first termination circuit is inactivated by the first control signal whose potential level has been changed from the second potential level to the first potential level.

2. The semiconductor integrated circuit according to claim 1, wherein:
   the transmitter-receiver is connected to a second external semiconductor integrated circuit through the first external terminal and the second external terminal, and
   the second semiconductor integrated circuit comprises a second termination circuit.

3. The semiconductor integrated circuit according to claim 2, wherein the data reception interval of the transmitter-receiver is determined in accordance with a write latency of previous transmitted data of the second semiconductor integrated circuit and a write latency of subsequently-transmitted another transmitted data.

4. The semiconductor integrated circuit according to claim 2, wherein:
   each of the previous transmitted data and the subsequently-transmitted another transmitted data of the second semiconductor integrated circuit is burst data, each having a predetermined burst length, and
   the data reception interval of the transmitter-receiver is determined in accordance with the burst lengths.

5. The semiconductor integrated circuit according to claim 2, wherein:
   the first termination circuit comprises:
   a first resistor provided between a first power supply and the first external terminal; and
   a first switch that controls a current flowing through the first resistor to be turned on and off, and
   the first semiconductor integrated circuit further comprises a control circuit that outputs a second control signal to the first termination circuit so that: the first switch is turned on when the second semiconductor integrated circuit transmits the data through the first external terminal; the first switch is turned off when the second semiconductor integrated circuit receives the data through the first external terminal; the first switch is continuously on when the second semiconductor integrated circuit further transmits another data after transmitting the data and when a data transmission interval from a time when the previous data is transmitted to a time when the another data is transmitted is equal to or smaller than a second threshold; and the first switch is changed from an on-state to an off-state when the data transmission interval exceeds the second threshold.

6. The semiconductor integrated circuit according to claim 5, wherein the control circuit outputs the second control signal based on the first control signal.

7. The semiconductor integrated circuit according to claim 5, wherein the data transmission interval of the transmitter-receiver is determined in accordance with a period between a time when the second semiconductor integrated circuit outputs a command for receiving data to the transmitter-receiver and a time when the second semiconductor integrated circuit further outputs a command for receiving the another data.

8. The semiconductor integrated circuit according to claim 5, wherein the data transmission interval of the transmitter-receiver is determined in accordance with a latency between a time when the second semiconductor integrated circuit outputs a command for receiving data to the transmitter-receiver and a time when the second semiconductor integrated circuit starts to receive the data.

9. The semiconductor integrated circuit according to claim 5, wherein:
   the data that the second semiconductor integrated circuit receives from the transmitter-receiver is burst data, and
   the data transmission interval of the transmitter-receiver is determined in accordance with a burst length of the received data.

* * * * *